United States Patent
Nakamura et al.

(10) Patent No.: US 6,447,846 B2
(45) Date of Patent: Sep. 10, 2002

(54) ELECTRICALLY INSULATING THIN-FILM-FORMING RESIN COMPOSITION AND METHOD FOR FORMING THIN FILM THEREFROM

(75) Inventors: Takashi Nakamura; Kiyotaka Sawa; Akihiko Kobayashi; Katsutoshi Mine, all of Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

(21) Appl. No.: 09/765,204

(22) Filed: Jan. 18, 2001

(30) Foreign Application Priority Data

Apr. 6, 2000 (JP) .......................................... 2000-104430

(51) Int. Cl.⁷ ................................................. B05D 3/02
(52) U.S. Cl. ...................... 427/387; 524/356; 524/261; 524/588; 525/474; 525/477; 525/479; 427/226; 427/397.7; 427/126.2; 428/447; 428/450; 428/500; 528/31; 556/451

(58) Field of Search ................................. 524/356, 261, 524/588; 525/474, 477, 479; 427/226, 397.7, 387, 126.2; 428/447, 450, 500; 528/31; 556/451

(56) References Cited

U.S. PATENT DOCUMENTS

| 5,162,558 A | * | 11/1992 | Ardaud et al. |
| 5,370,904 A | * | 12/1994 | Mine et al. |
| 5,776,599 A | * | 7/1998 | Haluska et al. |
| 6,074,695 A | | 6/2000 | Kobayashi et al. ......... 427/245 |
| 6,149,966 A | | 11/2000 | Kobayshi et al. ............. 427/58 |

* cited by examiner

*Primary Examiner*—Robert Dawson
*Assistant Examiner*—Kuo-Liang Peng
(74) *Attorney, Agent, or Firm*—Rick D. Streu; Sharon K. Severance

(57) ABSTRACT

An electrically insulating thin-film-forming resin composition comprising (A) a hydrogen silsesquioxane resin, (B) a solvent-soluble polymer, and (C) a solvent; and a method for forming an electrically insulating thin film therefrom.

13 Claims, No Drawings

ELECTRICALLY INSULATING THIN-FILM-FORMING RESIN COMPOSITION AND METHOD FOR FORMING THIN FILM THEREFROM

FIELD OF THE INVENTION

The present invention relates to an electrically insulating thin-film-forming resin composition, and to a method for forming an electrically insulating thin film. More particularly the present invention relates to an electrically insulating thin-film-forming resin composition that forms a thin film having a low dielectric constant, and to a method for efficiently forming an electrically insulating thin film having a low dielectric constant on the surface of an electronic device.

Examples of a method for forming an electrically insulating thin film on the surface of an electronic device include a method in which the surface of an electronic device is coated with a hydrogen silsesquioxane resin solution, the solvent is evaporated off, and the surface is then heated at 150 to 1000° C.(see Japanese Laid-Open Patent Application S63-144525), and a method in which the surface of an electronic device is coated with a solution of a hydrogen silsesquioxane resin and a platinum or rhodium catalyst, the solvent is evaporated off, and the surface is then heated at 150 to 1000° C. (see Japanese Laid-Open Patent Application S63-144524).

As miniaturization and integration have increased in electronic devices in recent years, there has been a need for a method for forming an electrically insulating layer with a low dielectric constant. More specifically, there is a need for a method for forming an electrically insulating layer with a low dielectric constant (a specific inductive capacity of less than 2.5) in a highly integrated circuit with a next-generation design rule of 0.15 µm or less. Accordingly, Japanese Laid-Open Patent Application H10-279687 proposes a method in which the surface of an electronic device is coated with a solution composed of a hydrogen silsesquioxane resin and two types of solvent with different boiling points or affinity to this resin, after which part of the solvent is evaporated, and the surface is heated to evaporate the solvent either during or after the crosslinking of the resin, thereby forming a porous electrically insulating crosslinked thin film.

However, a porous electrically insulating thin film generally has poor mechanical strength and is susceptible to infiltration and attack by a variety of chemicals, and therefore cannot sufficiently stand up to next-generation multilayer wiring processes, and particularly a, copper dual damascene process, making such films impractical. Also, to form an electrically insulating thin film with a low dielectric constant, a relatively large amount of silicon atom-bonded hydrogen atoms must be present in the hydrogen silsesquioxane resin, and consequently the silicon atom-bonded hydrogen atoms in the thin film react due to the heat, various chemicals, or plasma encountered in the various steps following the formation of the thin film, such as the multilayer wiring of an electronic device, which further raises the density of the thin film and drives up the dielectric constant.

Specifically, it is an object of the present invention to provide an electrically insulating thin-film-forming resin composition with which it is possible to form an electrically insulating thin film having a low dielectric constant, and to a method for efficiently forming an electrically insulating thin film having a low dielectric constant on an electronic device surface.

SUMMARY OF THE INVENTION

The present invention is an electrically insulating thin-film-forming resin composition comprising (A) a hydrogen silsesquioxane resin, (B) a solvent-soluble polymer, and (C) a solvent; and a method for forming an electrically insulating thin film therefrom.

DESCRIPTION OF THE INVENTION

The present. invention is an electrically insulating thin-film-forming resin composition comprising (A) a hydrogen silsesquioxane resin, (B) a solvent-soluble polymer, and (C) a solvent; and a method for forming an electrically insulating thin film therefrom.

First, the electrically insulating thin-film-forming resin composition of the present invention will be described in detail. The hydrogen silsesquioxane resin of component (A) is a polysiloxane whose main skeleton consists of trifunctional siloxane units described by formula $HSiO_{3/2}$. Because there are no organic groups in the main skeleton, an electrically insulating thin film with a relatively low dielectric constant can be formed. There are no particular restrictions on the molecular structure of component (A) and examples include a cage structure, ladder structure, and three-dimensional structures. The hydrogen silsesquioxane resin may be capped at its molecular chain terminals, for example, with hydroxyl groups; trimethylsiloxy groups or other trimethylorganosiloxy groups; and dimethylhydrogensiloxy groups. An example of a method for preparing this hydrogen silsesquioxane resin is the hydrolysis and polycondensation of trichlorosilane, as discussed in Japanese Patent Publication S47-31838. Trichlorosilane and a small amount of a triorganochlorosilane such as trimethylchlorosilane or a diorganochlorosilane such as dimethylchlorosilane may also be subjected to cohydrolysis and polycondensation.

Component (B) serves to further lower the dielectric constant of the electrically insulating thin film obtained by crosslinking component (A), and is a solvent-soluble polymer. Component (B) may or may not have groups that react with the silicon atom-bonded hydrogen atoms in component (A). There are no restrictions on this polymer as long as it dissolves in the solvent of component (C), is miscible with component (A) or the crosslinked product of component (A), and does not bleed from the obtained electrically insulating thin film. The weight average molecular weight of component (B) is preferably between 1000 and 1,000,000, with a range of 3000 to 1,000,000 being particularly favorable. Examples of component (B) include polyimide resins, fluorocarbon resins, benzocyclobutene resins, fluoridated polyallyl ether resins, polyisobutylene resins, polystyrene resins, and other such organic polymers; and linear organopolysiloxanes, branched organopolysiloxanes, resin-form organopolysiloxanes, and other such organopolysiloxanes. When component (B) has groups that react with the silicon atom-bonded hydrogen atoms in component (A), examples of these groups include aliphatic unsaturated groups, hydroxyl groups, and alkoxy groups.

There are no restrictions on the amount in which component (B) is contained in the present composition, but the amount is preferably 1 to 200 weight parts per 100 weight parts of component (A), with a range of 1 to 150 weight parts being even better, and a range of 1 to 100 weight parts being particularly favorable. This is because the obtained electrically insulating thin film will tend not to have a low dielectric constant if the component (B) content is below the lower limit of the above range, but if the upper limit of this range is exceeded the resin composition will tend not to form an electrically insulating thin film.

There are no particular restrictions on the solvent of component (C) as long as it will dissolve components (A) and (B) without causing any chemical changes in them. Examples of useful solvents include toluene, xylene, and other aromatic solvents; hexane, heptane, octane, and other aliphatic solvents; methyl ethyl ketone, methyl isobutyl ketone, and other ketone-based solvents; butyl acetate, isoamyl acetate, and other aliphatic ester-based solvents; hexamethyldisiloxane, 1,1,3,3-tetramethyldisiloxane, and other linear methylsiloxanes, 1,1,3,3,5,5,7,7-octamethylcyclotetrasiloxane, 1,3,5,7-tetramethylcyclotetrasiloxane, and other cyclic siloxanes; and silane compounds such as tetramethylsilane and dimethyldiethylsilane. Methyl isobutyl ketone and siloxanes are particularly favorable as solvents.

There are no restrictions on the amount in which component (C) is contained in the present composition, but the amount is preferably at least 50 weight parts per 100 weight parts of component (A). This is because it will tend to be difficult to apply a thin coating of the resulting resin composition over the surface of a base material such as an electronic device if the component (C) content is below the lower limit of the above range.

It is also desirable for the present composition to contain (D) a catalyst that will promote the reaction between component (A) and component (B) where component (B) has groups that react with the silicon atom-bonded hydrogen atoms in component (A). Examples of this catalyst include particulate platinum, chloroplatinic acid, an alcohol solution of chloroplatinic acid, an olefin complex of platinum, an alkenylsiloxane complex of platinum, a carbonyl complex of platinum, and other such platinum-based catalysts; rhodium catalysts; dibutyltin diacetate, dibutyltin dioctoate, and other such tin-based catalysts; and tetrabutyl titanate, tetrapropyl titanate, and other such titanium-based catalysts. The amount in which this catalyst is contained in the present composition is preferably between 1 and 1000 weight parts per million weight parts of component (A) and component (B) combined. A sensitizer may also be added if the present composition is to be crosslinked solely by irradiation with high-energy rays.

The method of the present invention for forming an electrically insulating thin film will now be described in detail. The method of the present invention for forming an electrically insulating thin film is characterized in that the surface of an electronic device is coated with .the abovementioned electrically insulating thin-film-forming resin composition, and all or part of the solvent is evaporated, after which the electrically insulating organic resin contained in the composition is crosslinked by heating and/or irradiation with high-energy rays.

Examples of methods for coating the electronic device surface with the electrically insulating thin-film-forming resin composition include spin coating, dip coating, spray coating, and flow coating. The electrically insulating thin film is cured by heating and/or irradiation with high-energy rays. When the resulting electrically insulating thin film needs to be smoothed, it is preferable to heat it at a temperature higher than the melting point of component (A) and/or component (B). Examples of heating methods include the use of a heating furnace or a hot plate. When irradiation with high-energy rays is employed, examples of high-energy rays that can be used include ultraviolet rays, infrared rays, X-rays, and an electron beam. The use of an electron beam is particularly favorable because component (A) alone, or components (A) and (B) together, can be thoroughly crosslinked.

Examples

The electrically insulating thin-film-forming resin composition and the method for forming an electrically insulating thin film of the present invention will now be described in detail through examples. The property values in the examples were measured at 25° C. The degree of crosslinking was determined by measuring the percent of residual SiH in the electrically insulating thin film by Fourier transform UV absorption spectrographic analysis. The residual SiH percentage in the electrically insulating thin film is the amount of silicon atom-bonded hydrogen atoms contained in the cured electrically insulating thin film relative to the amount of silicon atom-bonded hydrogen atoms contained in the electrically insulating thin-film-forming resin composition immediately after spin coating on a silicon wafer. The dielectric constant of the electrically insulating thin film was measured by an impedance analyzer (sandwiched aluminum electrode type) at 25° C.and 1 MHz using an electrically insulating thin film formed on a silicon wafer with a resistivity of $10^{-2} \Omega \cdot$ cm or less.

Reference Example 1. 6 mol Of toluene were added dropwise over a period of 1 hour to a mixture of 3.75 mol sulfuric acid and 2.25 mol fuming sulfuric acid at a mixture temperature of 45 to 60° C. The reaction mixture was heated for another 30 minutes at 45° C., which gave toluenesulfonic acid monohydrate. A mixture of 1 mol trichlorosilane and 6.6 molitoluene was added dropwise to this over a period of 5 hours at 30° C., and the reaction mixture was heated for another 30 minutes at 45° C. After the solution was allowed to cool and separate, the toluenesulfonic acid layer (at the bottom) was removed, after which the top layer was washed with a suitable amount of sulfuric acid/water (50/50 weight ratio), then with a suitable amount of sulfuric acid/water (25/75 weight ratio), and then with pure water in order to remove the acid contained in the top layer. Azeotropic dehydration was then performed for 1 hour in order to remove the water completely. The toluene solution obtained in this manner was put under reduced pressure with a vacuum pump at 60° C. to remove the toluene, which gave a hydrogen silsesquioxane resin whose main skeleton consisted of siloxane units described by formula $HSiO_{3/2}$. This hydrogen silsesquioxane resin had a number average molecular weight of 1650, and the ratio of the weight average molecular weight/number average molecular weight was 19.4.

Then, 20 g of the above hydrogen silsesquioxane resin were put into a 1 L round-bottomed glass flask that had been thoroughly dried. 80 g Of dehydrated toluene were added and the resin was thoroughly dissolved. The entire mixture was held at 25° C. while being purged with nitrogen to the extent that the solvent would not volatilize and escape from the system, and this purging was continued until the completion of separation. 50 g Of dehydrated acetonitrile were added dropwise over a period of 1 hour while the solution was agitated briskly. The resulting mixture was allowed to stand for about 12 hours, after which the precipitate was removed. Another 200 g of dehydrated acetonitrile was added dropwise over a period of 4 hours to the solution from which the precipitate had been removed. The resulting precipitate was collected, and the remaining solvent was removed by vacuum drying at normal temperature to prepare a hydrogen silsesquioxane resin. The number average molecular weight of this hydrogen silsesquioxane resin was 11,400, the ratio of weight average molecular weight/number average molecular weight was 2.88, and the ionic impurity and metal impurity contents were each less than 1 ppm.

Example 1

An electrically insulating thin-film-forming resin composition was prepared comprising 22 wt % of the hydrogen silsesquioxane resin prepared in reference example 1, 8 wt % dimethylpolysiloxane capped at both ends of the molecular chain with trimethylsiloxane groups, and 70 wt % methyl isobutyl ketone. This composition was then spin coated on a silicon wafer for 5 seconds of pre-spinning (500 rpm) and 10 seconds of main spinning (3000 rpm), after which the coating was irradiated with an electron beam (300 Mrad) accelerated at 165 kV, forming an electrically insulating thin film with a thickness of 980 nm, a residual SiH content of 52%, and a specific inductive capacity of 2.4.

Example 2

An electrically insulating thin-film-forming resin composition was prepared comprising 15 wt % of the hydrogen silsesquioxane resin prepared in reference example 1, 7 wt % benzocyclobutene resin with a weight average molecular weight of approximately 20,000, 65 wt % methyl isobutyl ketone, and 13 wt % mesitylene. This composition was then spin coated on a silicon wafer for 5 seconds of pre-spinning (500 rpm) and 10 seconds of main spinning (3000 rpm), after which the coating was irradiated with an electron beam (300 Mrad) accelerated at 165 kV, and was then heated for 15 minutes at 100° C. and then another hour at 250° C. in a quartz furnace under a nitrogen atmosphere, forming an electrically insulating thin film with a thickness of 620 nm, a residual SiH content of 51%, and a specific inductive capacity of 2.4.

Comparative Example 1

An electrically insulating thin-film-forming resin composition was prepared comprising 22 wt % of the hydrogen silsesquioxane resin prepared in reference example 1 and 78 wt % 1,1,1,3,3,5,5,5-octamethyltrisiloxane. This composition was then spin coated on a silicon wafer for 5 seconds of pre-spinning (500 rpm) and 10 seconds of main spinning (3000 rpm), after which the coating was heated for 1 minute each on 150° C., 250° C., and 350° C. hot plates, and was then heated for 1 hour in a quartz furnace (400° C.) under a nitrogen atmosphere, forming an electrically insulating thin film with a thickness of 520 nm, a residual SiH content of 70%, and a specific inductive capacity of 3.0.

We claim:

1. An electrically insulating thin-film-forming resin composition comprising (A) a hydrogen silsesquioxane resin, (B) a solvent-soluble polymer selected from polyimide resins, fluorocarbon resins or benzocyclobutene resins, and (C) a solvent.

2. An electrically insulating thin-film-forming resin composition according to claim 1, where component (B) is a benzocyclobutene resin.

3. A method for forming an electrically insulating thin film comprising coating the surface of an electronic device with an electrically insulating thin-film-forming resin composition comprising (A) a hydrogen silsesquioxane resin, (B) a solvent-soluble polymer selected from polyimide resins, fluorocarbon resins or benzocyclobutene resins, and (C) a solvent-evaporating part or all of the solvent, and curing the resin composition by a method selected from the group consisting of heating and irradiation with high-energy rays.

4. A method for forming an electrically insulating thin film according to claim 3, where component (B) is an benzocyclobutene resin.

5. An electrically insulating thin-film-forming resin composition comprising (A) a hydrogen silsesquioxane resin, (B) a solvent-soluble polymer that contains groups that react with silicon-bonded hydrogen atoms of component (A), and (C) a solvent.

6. An electrically insulating thin-film-forming resin composition according to claim 5, where component (B) has aliphatic unsaturated groups.

7. An electrically insulating thin-film-forming resin composition according to claim 5, where component (B) has a weight average molecular weight between 1,000 and 1,000,000.

8. An electrically insulating thin-film-forming resin composition according to claim 5, where component (B) has a weight average molecular weight in the range of 3,000 to 1,000,000.

9. An electrically insulating thin-film-forming resin composition according to claim 5, where component (C) is a solvent selected from the group consisting of methyl isobutyl ketone and siloxanes.

10. A method for forming an electrically insulating thin film comprising coating the surface of an electronic device with an electrically insulating thin-film-forming resin composition comprising (A) a hydrogen silsesquioxane resin, (B) a solvent-soluble polymer that contains groups that react with silicon-bonded hydrogen atoms of component (A) and (C) a solvent, evaporating part or all of the solvent, and curing the resin composition by a method selected from the group consisting of heating and irradiation with high-energy rays.

11. A method for forming an electrically insulating thin film according to claim 10, where component (B) has a weight average molecular weight between 1,000 and 1,000,000.

12. A method for forming an electrically insulating thin film according to claim 10, where component (B) has a-weight average molecular weight in the range of 3,000 to 1,000,000.

13. A method for forming an electrically insulating thin film according to claim 10, where the groups that react with silicon-bonded hydrogen atoms of component (A) are aliphatic unsaturated groups.

* * * * *